United States Patent
Fan et al.

(10) Patent No.: US 10,440,842 B2
(45) Date of Patent: Oct. 8, 2019

(54) FLEXIBLE ELECTRONIC DEVICE

(71) Applicant: Lenovo (Beijing) Co., Ltd., Beijing (CN)

(72) Inventors: Xiaoli Fan, Beijing (CN); Changlong Zuo, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 15/923,692

(22) Filed: Mar. 16, 2018

(65) Prior Publication Data

US 2018/0270964 A1   Sep. 20, 2018

(30) Foreign Application Priority Data

Mar. 17, 2017 (CN) .......................... 2017 1 0161712

(51) Int. Cl.
| | |
|---|---|
| *H05K 5/00* | (2006.01) |
| *H05K 5/02* | (2006.01) |
| *G09F 9/30* | (2006.01) |
| *E05D 3/06* | (2006.01) |
| *G06F 1/16* | (2006.01) |

(52) U.S. Cl.
CPC ........... *H05K 5/0017* (2013.01); *G09F 9/301* (2013.01); *H05K 5/0217* (2013.01); *E05D 3/06* (2013.01); *E05Y 2900/606* (2013.01); *G06F 1/1652* (2013.01)

(58) Field of Classification Search
CPC ...... G06F 1/16; H05K 5/0017; H05K 5/0217; G09F 9/301
See application file for complete search history.

(56) References Cited

U.S. PATENT DOCUMENTS

| | | | |
|---|---|---|---|
| 8,009,421 B2 * | 8/2011 | Misawa ............ | G02F 1/133305 345/156 |
| 2004/0183958 A1 * | 9/2004 | Akiyama .......... | G02F 1/133305 349/58 |
| 2005/0040962 A1 * | 2/2005 | Funkhouser .......... | G06F 1/1601 340/815.4 |
| 2008/0013292 A1 | 1/2008 | Slikkerveer et al. | |
| 2008/0198541 A1 * | 8/2008 | Lin ....................... | G06F 1/1615 361/679.05 |

FOREIGN PATENT DOCUMENTS

| | | |
|---|---|---|
| CN | 104424844 A | 3/2015 |
| CN | 105513497 A | 4/2016 |
| CN | 105830140 A | 8/2016 |
| CN | 106504649 A | 3/2017 |

* cited by examiner

*Primary Examiner* — Hoa C Nguyen
*Assistant Examiner* — Keith DePew
(74) *Attorney, Agent, or Firm* — Anova Law Group, PLLC

(57) ABSTRACT

A flexible electronic device includes a flexible shaft including a first side and a second side not parallel to each other, and a flexible screen coupled to the first side. The first side deforms with a rotation of the flexible shaft and the second side does not deform with the rotation of the flexible shaft. The flexible screen deforms in synchronism with a deformation of the first side.

18 Claims, 6 Drawing Sheets

FLEXIBLE ELECTRONIC DEVICE

CROSS-REFERENCES TO RELATED APPLICATIONS

This application claims priority to Chinese Patent Application No. 201710161712.5, filed on Mar. 17, 2017, the entire contents of which are incorporated herein by reference.

TECHNICAL FIELD

The present disclosure relates to the field of electronic device technology and, more particularly, to a flexible electronic device.

BACKGROUND

Comparing to the traditional screens, flexible screens can have a thinner volume and a lower power consumption. Based on the flexibility characteristic of the flexible screens, more and more manufacturers began to develop related flexible electronic products. For example, a flexible screen may be used as a display of a flexible electronic device. The flexible screen can be fixed to a housing of the flexible electronic device to make a certain degree of curvature, such that an image displayed on the flexible screen can be viewed in normal status from different directions.

Generally, the flexible screen can be bonded to the housing of the electronic device, such that the flexible screen can be bent by a pressing action of the housing, and be supported by one or more supporting members in the flexible electronic device. Such arrangement can ensure a certain degree of flexibility and rigidity of the flexible screen. However, the size of the flexible screen is not reduced, resulting in a relatively large volume of the flexible electronic device, which may affect the portability of the flexible electronic device.

SUMMARY

In accordance with the disclosure, there is provided a flexible electronic device including a flexible shaft including a first side and a second side not parallel to each other, and a flexible screen coupled to the first side. The first side deforms with a rotation of the flexible shaft and the second side does not deform with the rotation of the flexible shaft. The flexible screen deforms in synchronism with a deformation of the first side.

BRIEF DESCRIPTION OF THE DRAWINGS

Various objectives, features, and advantages of the present disclosure can be more fully appreciated with reference to the detailed description of embodiments in connection with the following drawings, in which same reference numerals refer to the same or like elements unless otherwise specified. The following drawings are merely examples for illustrative purposes according to various disclosed embodiments and are not intended to limit the scope of the present disclosure.

DETAILED DESCRIPTION

Embodiments of the disclosure will be described in detail with reference to the accompanying drawings. The following description is made only by way of example, but does not limit the present disclosure. Various embodiments of the present disclosure and various features in the embodiments that do not conflict with each other can be combined and rearranged in various ways. Without departing from the spirit and scope of the present disclosure, modifications, equivalents, or improvements to the present disclosure are conceivable to those skilled in the art and are intended to be encompassed within the scope of the present disclosure.

In accordance with various embodiments, the present disclosure provides a flexible electronic device. The disclosed flexible electronic device can have a reduced volume to be carried easily, and can have an improved service life of the flexible screen.

Figure 1:
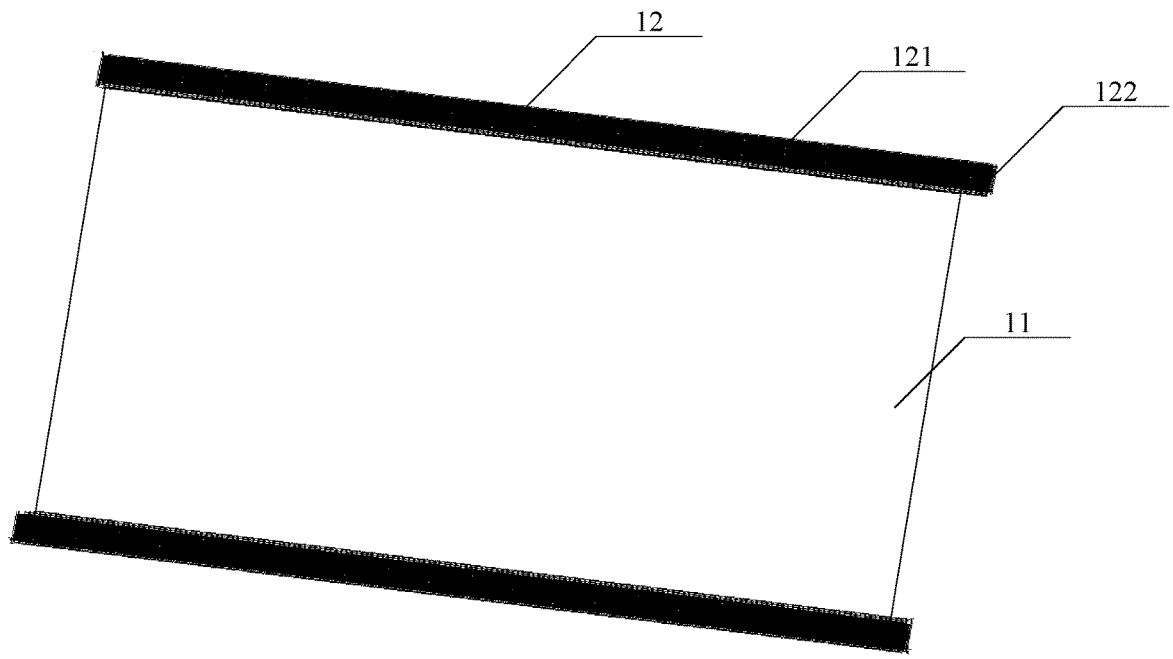
FIG. 1 illustrates a schematic structural diagram of an example of flexible electronic device in accordance with the present disclosure.

FIG. 1 illustrates a schematic structural diagram of an example of flexible electronic device in accordance with the present disclosure. The flexible electronic device includes a flexible screen 11 and at least one flexible shaft 12.

The flexible shaft 12 includes a first side 121 and a second side 122. As shown in FIG. 1, the first side 121 and the second side 122 are not parallel to each other. The first side 121 of the flexible shaft 12 can be deformed with the rotation of the flexible shaft 12. The second side 122 of the flexible shaft 12 adjacent to the first side 121 is not deformable with the rotation of the flexible shaft 12. That is, in the flexible shaft 12, only the first side 121 may be deformed with the rotation of the flexible shaft. For example, when the flexible shaft 12 is rotated towards a vertical direction parallel to the direction of the first side 121, the first side 121 can be bent towards the vertical direction to change the first side 121 from a flat state to a bent state.

The flexible screen 11 can be disposed adjacent to the first side 121. For example, the flexible screen 11 may be embedded in the first side 121, or be connected to the first side 121 by any other suitable way. As such, the flexible screen 11 can be deformed in synchronism with the deformation of the first side 121.

Figure 2:
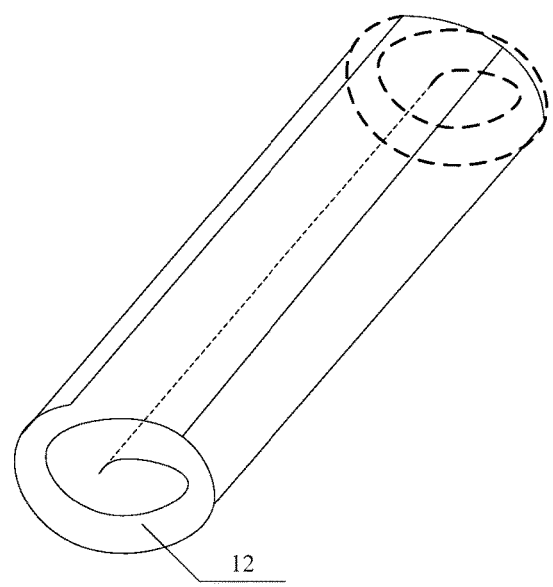
FIG. 2 illustrates a schematic diagram of an example of flexible electronic device in a bent state in accordance with the present disclosure.

FIG. 2 illustrates a schematic diagram of an example of flexible electronic device in a bent state in accordance with the present disclosure. When the first side 121 changes from the flat state to the bent state, the flexible screen 11 can also be deformed from the flat state shown in FIG. 1 to the bent state shown in FIG. 2.

Consequently, the volume of the flexible electronic device can be reduced in the bent state. When the flexible screen changes from the flat state into the bent state, the flexible electronic device can be folded to reduce volume, making the flexible electronic device more portable.

When the flexible screen 11 is disposed adjacent to the first side 121, a distance between the flexible screen 11 and the second side 122 can be within a preset distance range. The distance between the flexible screen 11 and the second side 122 can be minimized to increase the display area of the flexible electronic device, such that the flexible electronic device can be designed to have a large screen. It is to be noted here that, the preset distance range may depend on the sizes of the flexible screen 11 and the flexible shaft 12, and is not limited herein.

When the flexible electronic device in the flat state, the flexible screen 11 can be in a horizontal position parallel to the horizontal plane, and the flexible shaft 12 can stop at any position during the rotation to form a plurality of use modes. For example, the flexible shaft 12 can be rotated from 0 degree to 180 degrees.

Figure 3:
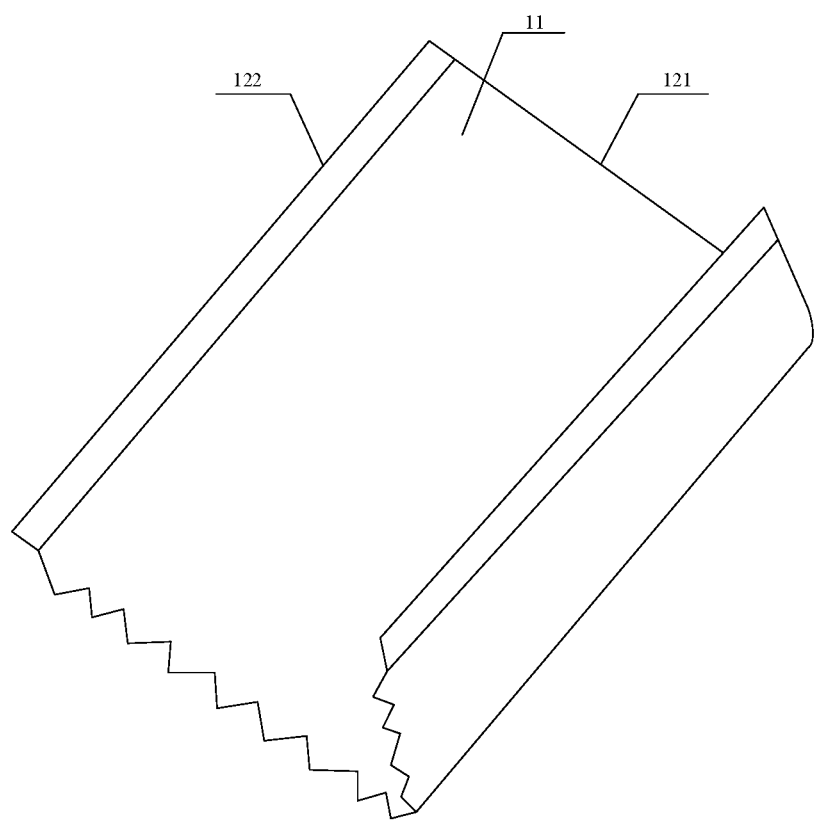
FIG. 3 illustrates a schematic diagram of an example of flexible electronic device having a certain bending angle in accordance with the present disclosure.

FIG. 3 illustrates a schematic diagram of an example of flexible electronic device having a certain bending angle in accordance with the present disclosure. As shown in FIG. 3, the flexible shaft 12 is bent towards a display direction of the flexible screen 11, and the bending angle is more than 90 degrees. The flexible shaft 12 does not rotate towards other directions when the first side 121 of the flexible shaft 12 and the flexible screen 11 are in the flat state. That is, the first side 121 of the flexible shaft 12 and the flexible screen 11 can be bent with the flexible shaft 12 towards the display direction of the flexible screen 11, but may not be bent towards the direction opposite to the display direction of the flexible screen 11.

The material of the flexible screen 11 can have a fully elastic deformation range which conforms to Hook's law. When the deformation of the flexible screen 11 is small, atoms/ions/molecules of the material of the flexible screen 11 may undergo a reversible displacement from self-equilibrium positions and thus the material of the flexible screen 11 will not be damaged. That is, when the flexible screen 11 is deformed in synchronism with the deformation of the first side 121 of the flexible shaft 11, a neutral layer of the flexible screen 11 is subjected to a small tensile stress and a small compressive stress while bending. The deformation of the neutral layer of the flexible screen 11 is small under the small tensile stress and the small compressive stress, such that the electrical function of the flexible screen may not be damaged. For example, depending on the manufacturing process and the composition material of the flexible screen of different suppliers, the deformation of the neutral layer of the flexible screen 11 can be 0.5% or less.

When the flexible shaft 12 is in the flat state, an overlap error between the neutral layer of the flexible screen 11 and a neutral layer of the flexible shaft 12 can be within a preset range, such as smaller than about 0.1 mm. As such, when the deformation of the flexible screen 11 is synchronized with the deformation of the first side 121 of the flexible shaft 12, the deformation of the neutral layer of the flexible screen 11 can be reduced. Therefore, the probability of the electrical function of the flexible screen being damaged can be decreased, and the service life of the flexible screen can be increased.

When the flexible shaft 12 and the flexible screen 11 are in the bent state, outer layers of the flexible shaft 12 and the flexible screen 11 are stretched, and inner layers of the flexible shaft 12 and the flexible screen 11 are compressed. In the cross section of each of the flexible shaft 12 and the flexible screen 11, a transition layer that is neither stretched nor compressed may exist. That is, the tensile stress and compressive stress on the transition layer are close to zero. Such a transition layer in the flexible shaft 12 or the flexible screen 11 is referred to as the neutral layer in the flexible shaft 12 or the flexible screen 11, as schematically indicated by the dashed lines in FIG. 11.

The flexible screen 11 and the flexible shaft 12 do not overlap in the direction of the second side 122 of the flexible shaft 12. When the flexible screen 11 is in the bent state, the flexible screen 11 extends in the direction of the second side 122 of the flexible shaft 12 under the action of a small tensile stress. Since the flexible screen 11 and the flexible shaft 12 do not overlap in the direction of the second side 122, the flexible screen 11 may not be damaged by the second side 122 when the flexible screen 11 extends in the direction of the second side 122 of the flexible shaft 12. As such, the service life of the flexible screen 11 can be increased.

Figure 4:
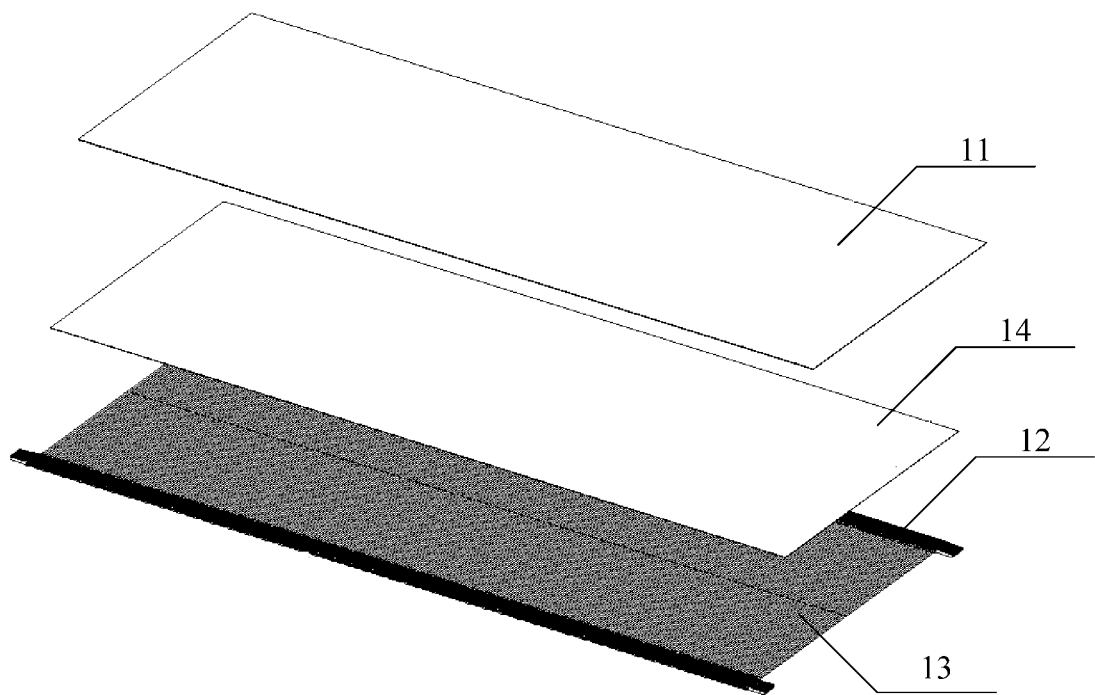
FIG. 4 illustrates a schematic structural diagram of another example of flexible electronic device in accordance with the present disclosure.

FIG. 4 illustrates a schematic structural diagram of another example of flexible electronic device in accordance with the present disclosure. The flexible electronic device shown in FIG. 4 includes the flexible screen 11, the flexible shaft 12, a support member 13 connecting to the first side 121 of the flexible shaft 12. The support member 13 can be deformed in synchronism with the deformation of the first side 121 of the flexible shaft 12. For example, the support member 13 can change from the flat state to the bent state as it is synchronized with the first side 121 changing from the flat state to the bent state.

The flexible screen 11 is stacked on a first surface of the support member 13. When the flexible screen 11 is in the flat state, the first surface of the support member 13 can provide support to the flexible screen 11. As such, the flexible screen 11 can be regarded as a rigid screen in a flat state to improve the user's operating experience.

When the flexible shaft 12 and the support member 13 are in the flat state, a distance between the neutral layer of the flexible shaft 12 and the first surface of the support member 13 is greater than a first threshold value. As such, when the flexible screen 11 is placed on the first surface of the support member 13, an overlap error between the neutral layer of the flexible screen 11 and the neutral layer of the flexible shaft 12 can be within a preset range. Therefore, the deformation of the neutral layer of the flexible screen 11 can be reduced when the support member 13 and the flexible screen 11 are deformed in synchronism with the deformation of the first side 121 of the flexible shaft 12. Thus, the probability of the electrical function of the flexible screen being damaged can be decreased, and the service life of flexible screen can be increased.

In order to reduce the deformation of the neutral layer of the flexible screen 11, in some embodiments, as shown in FIG. 4, an adhesive layer 14 is provided between the first surface of the support member 13 and the flexible screen 11. The adhesive layer 14 can also be deformed when the support member 13 and the flexible screen 11 are deformed in synchronism with the deformation of the first side 121 of the flexible shaft 12. Since the adhesive layer 14 has a certain elasticity, the deformation of the neutral layer of the flexible screen 11 can be compensated by the elastic stretching of the adhesive layer 14. As such, the deformation of the neutral layer of the flexible screen 11 can be reduced.

In some embodiments, the adhesive layer 14 can include a high elasticity glue. The first surface of the support member 13 and the neutral layer of the flexible screen 11 can be bonded together by the high elasticity glue to provide a high adhesion between the neutral layer of the flexible screen 11 and the first surface of the support member 13, and to reduce the deformation of the neutral layer of the flexible screen 11.

A thickness of the adhesive layer 14 can be less than or equal to a maximum value of a preset range, and can be greater than a minimum value of the preset range. When the thickness of the adhesive layer 14 is equal to the maximum value of the preset range, the neutral layer of the flexible screen 11 and the neutral layer of the flexible shaft 12 are overlapped. In this case, the deformation of the neutral layer of the flexible screen 11 is minimized or close to zero. Thus, the probability of the electrical function of the flexible screen being damaged can be decreased, and the service life of flexible screen can be increased.

It is noted that, the maximum value of the preset range can be equal to a distance between the neutral layer of the flexible screen 11 and the neutral layer of the flexible shaft 12 when the flexible screen 11 is disposed adjacent to the first side 121 of the flexible shaft 12. The minimum value of the preset range can be set according to the actual situation and is not limited herein.

In some embodiments, the flexible electronic device shown in FIGS. 1-4 includes two flexible shafts. A first end in a longitudinal direction of the support member 13 can be connected with one of the two flexible shafts, and a second end in the longitudinal direction of the support member 13 can be connected with another one of the two flexible shafts. That is, the support members 13 are connected between the two flexible shafts, so that both ends of the support member 13 can be fixed by the two flexible shafts, respectively.

When the support member 13 is in the flat state, the first surface of the support member 13 can be a rigid horizontal plane, and both ends of the rigid horizontal plane are fixed. When a user is operating on the flexible screen 11, the first surface of the support member 13 can withstand the additional operating force of the user on the flexible screen 11. As such, the depression of the flexible screen 11 can be reduced when the user is operating on the flexible screen 11, thereby improving the user experience.

Accordingly, in the disclosed flexible device, the first surface of the support member 13 can be used to provide support to the flexible screen 11, such that the flexible screen 11 can be regarded as a rigid screen in the flat state to improve the user's operating experience. When the two ends of the support member 13 are respectively connected to the two flexible shafts, the first surface of the support member 13 can withstand the additional operating force of the user on the flexible screen 11 when the user is operating on the flexible screen. Thus, the depression of the flexible screen 11 can be reduced when the user is operating on the flexible screen 11, thereby improving the user experience.

Further, in the disclosed flexible device, the adhesive layer 14 can be provided between the first surface of the support member 13 and the flexible screen 11 to increase the adhesion of the first surface. As such, the flexible screen 11 can be securely fixed. Additionally, the adhesive layer 14 can also deform when the support member 13 and the flexible screen 11 are deformed in synchronism with the deformation of the first side 121 of the flexible shaft 12. Thus, the deformation of the neutral layer of the flexible screen 11 can be compensated to reduce the deformation of the neutral layer of the flexible screen 11.

Figure 5:
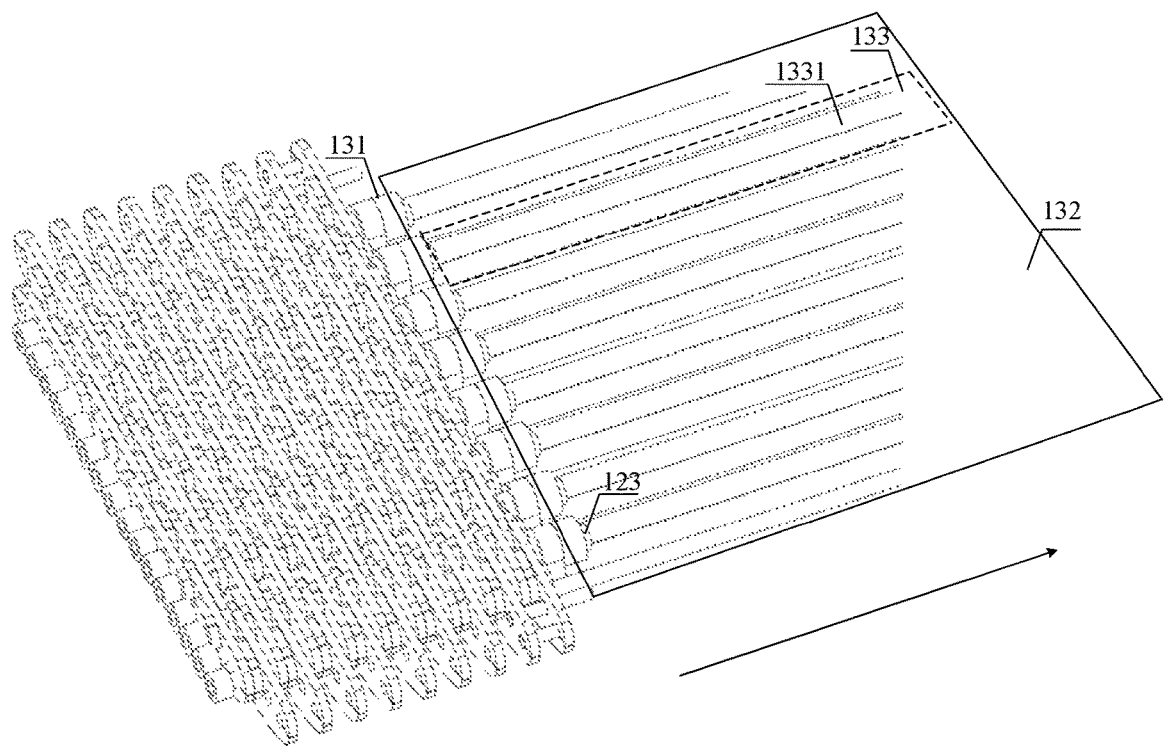
FIG. 5 illustrates a schematic structural diagram of an example of a support member in accordance with the present disclosure.

FIG. 5 illustrates a schematic structural diagram of an example of the support member in accordance with the present disclosure. As shown in FIG. 5, the support member 13 includes a connecting portion 131, and a carrying portion 132 which is represented by a solid frame in FIG. 5. The surface of the carrying portion 132 can serve as the first surface of the support member 13 to provide a support force to the flexible screen 11.

One end of the connecting portion 131 is connected to the first side of the flexible shaft 12, and the other end of the connecting portion 131 is connected to the carrying portion 132. The connecting portion 131 can be driven to deform the carrying portion 132 in synchronism with the deformation of the first side 121 of the flexible shaft 12.

In order to ensure that the carrying portion 132 moves together with the connecting portion 131 when the carrying portion 132 is driven by the connecting portion 131, the connecting portion 131 and the carrying portion 132 can be connected with each other by using any suitable manners. For example, the connecting portion 131 and the carrying portion 132 can be integrally designed. As another example, the connecting portion 131 and the carrying portion 132 can be connected by riveting, welding, or mechanical locking, etc.

In some embodiments, the carrying portion 132 can include a plurality of rigid metal strip groups 133 arranged in parallel. As shown in FIG. 5, the dashed-line box indicates a rigid metal strip group 133. A longitudinal direction of each rigid metal strip group 133 is perpendicular to the direction of the first side 121. The longitudinal direction is indicated by the arrow shown in FIG. 5.

At least one end of each rigid metal strip group 133 can be connected to a first type shaft 123 of the flexible shaft 12 through the connecting portion 131. When the flexible shaft 12 and the support member 13 are in the flat state, the plurality of rigid metal strip groups 133 arranged in parallel can form the first surface of the support member 13 to provide a certain support force for the flexible screen 11.

The first type shaft 123 of the flexible shaft 12 does not change the relative mounting position during the deformation of the flexible shaft 12. Other types of shafts of the flexible shaft 12 may change the relative mounting position during the deformation of the flexible shaft 12. As such, the first side 121 of the flexible shaft 12 can be deformed through the other types of shafts of the flexible shaft 12. The plurality of rigid metal strip groups 133 arranged in parallel to constitute the carrying portion 132 can be rotated through the first type shaft 123. Thus, the carrying portion 132 can deform with the deformation of the first side 121 of the flexible shaft 12.

Figure 6:
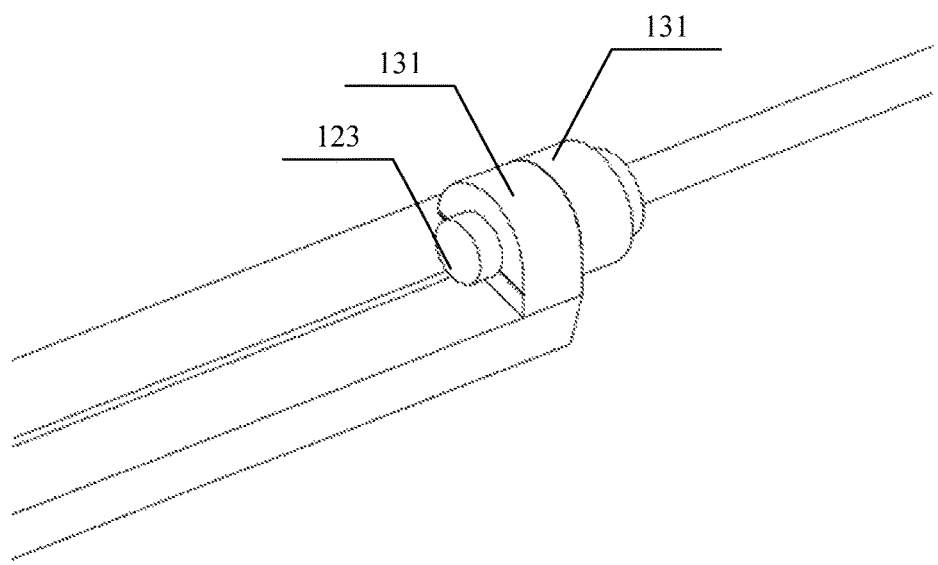
FIG. 6 illustrates a schematic diagram of an example of connection of a rigid metal strip group and a first type shaft in the flexible electronic device shown in FIG. 5.

FIG. 6 illustrates a schematic diagram of an example of connection of a rigid metal strip group and a first type shaft in the flexible electronic device shown in FIG. 5. The first type shaft 123 can be inserted in the connecting portion 131 of each rigid metal strip in the rigid metal strip group to fix the rigid metal strip group 133 and to drive the rigid metal strip group 133 to rotate.

In some embodiments, each rigid metal strip group 133 can include at least two rigid metal strips 1331. The longitudinal direction of each rigid metal strip 1331 can be perpendicular to the direction of the first side 121 of the flexible shaft 12. At least one end of each rigid metal strip is connected to the first type shaft 123 through the connecting portion 131. When the flexible shaft 12 and the support member 13 are in the flat state, all of the rigid metal strips 1331 in the rigid metal strip groups 133 can be arranged in a staggered arrangement to form a horizontal plane that serves as the first surface of the support member 13.

When the flexible shaft 12 and the support member 13 are in the flat state, all of the rigid metal strips can be staggered in parallel to form a seamless horizontal plane. As such, any position of the flexible screen 11 can be supported by the seamless horizontal plane. Thus, the flexible screen 11 can be regarded as a rigid screen when a user is operating at any position of the flexible screen 11.

In some embodiments, in the actual design, the elasticity and thickness of the adhesive layer 14 between the flexible screen 11 and the rigid metal strip groups 133 can be adjusted. A gap may be formed between adjacent rigid metal strips in the rigid metal strip groups when the rigid metal strip groups 133 are deformed with the first side 121 of the flexible shaft 12. Thus, the high elastic deformation, such as high elastic stretching, of the adhesive layer 14, can be used to reduce the influence of the tensile stress and the compressive stress on the flexible screen 11. When the size of the rigid metal strip is smaller, a distance between the first surface of the rigid metal strips and the neutral layer of the flexible screen 11 is smaller, or the adhesive layer 14 has a greater elasticity or a larger thickness, the effect of the tensile stress and the compressive stress on the flexible screen 11 can be smaller.

Figure 7:
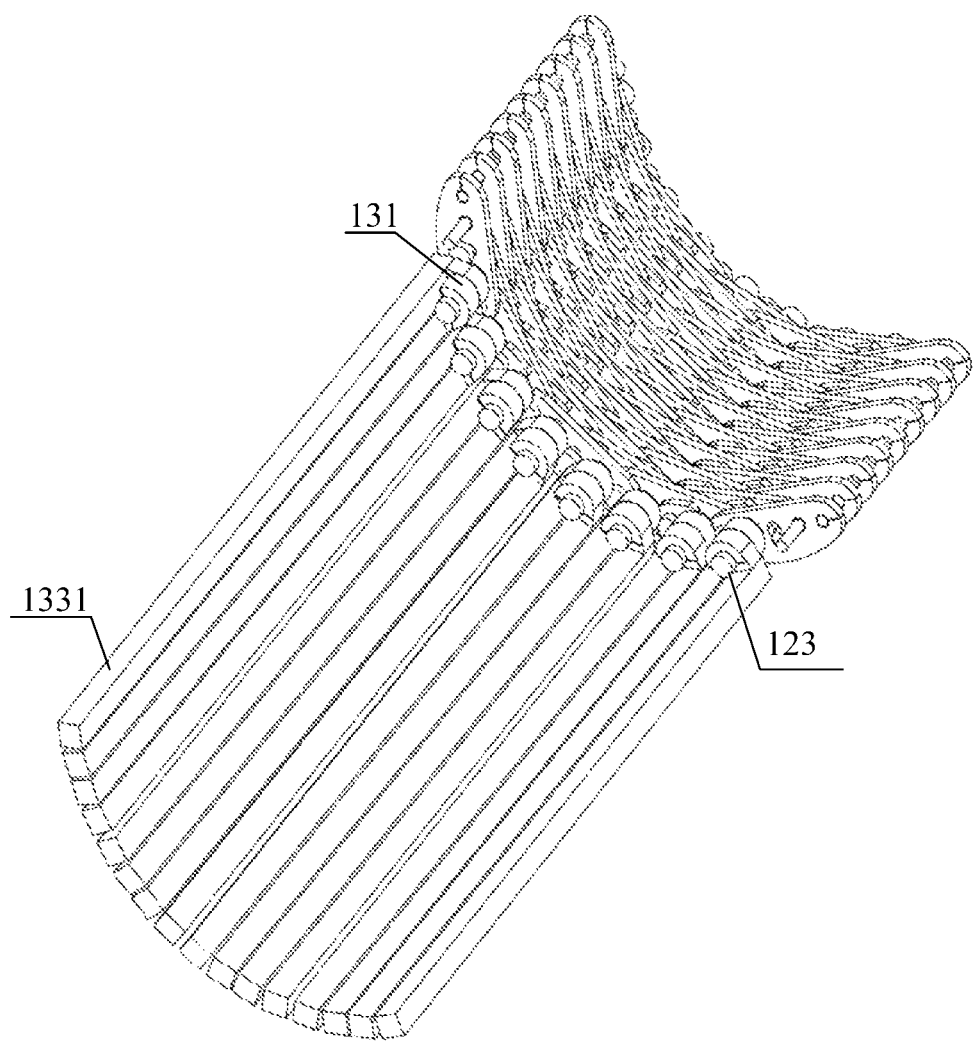
FIG. 7 illustrates a schematic diagram of an example of deformation of rigid metal strip group in accordance with the present disclosure.

FIG. 7 illustrates a schematic diagram of an example of deformation of the rigid metal strip group in accordance with the present disclosure. As shown in FIGS. 5-7, the connecting portion 131 has a hollow structure. The flexible shaft 12 can be fitted in the hollow structure to stabilize the flexible shaft 12 and the connecting portion 131 together. When the first side 121 of the flexible shaft 12 is deformed, the flexible shaft 12 can drive the connecting portion 131 to rotate. As such, the carrying portion 132 connected to the connection portion 131 can move together with the connection portion 131. Thus, the carrying portion 132 can deform with the deformation of the first side 121 of the flexible shaft 12. For example, as shown in FIG. 7, the first type shaft 123 of the flexible shaft 12 is fitted in the hollow structure.

Figure 8:
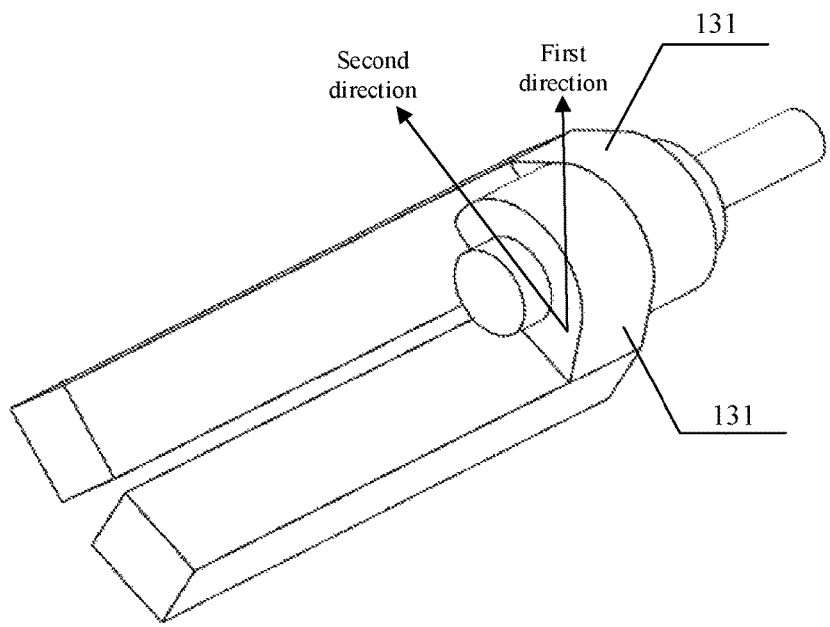
FIG. 8 illustrates a schematic diagram of an example of connection portion of two rigid metal strips in a rigid metal strip group in accordance with the present disclosure.

FIG. 8 illustrates a schematic diagram of an example of connection portion of two rigid metal strips in a rigid metal strip group in accordance with the present disclosure. The connecting portion 131 having the hollow structure can be a part of the rigid metal strip group 133. As shown in FIG. 8, the connecting portion 131 of a first rigid metal strip of a rigid metal strip group 133 includes a hollow circular member protruding in a first direction of the first rigid metal strip. The connecting portion 131 of a second rigid metal strip of the rigid metal strip group 133 includes a hollow semicircular member protruding in the first direction of the second rigid metal strip and extending in a second direction of the second rigid metal strip. The radius of the hollow circular member is smaller than the radius of the hollow semicircular member.

As shown in FIG. 8, when the flexible shaft 12 and the support member 13 are in a flat state, the first direction and the second direction are perpendicular to each other. As described above, the connection portions 131 of the rigid metal strips of a rigid metal strip group 133 protrude in different directions, the connection portion 131 of the second rigid metal strip extends in the second direction, and the radius of the hollow circular member is smaller than the radius of the hollow semicircular member. As such, when the rigid metal strip group 133 is deformed with the deformation of the first side 121, the rigid metal strips in the rigid metal strip group 133 do not affect each other. When the flexible shaft 12 and the supporting member 13 are in the flat state, the two connecting portions 131 can prevent the flexible shaft 12 from continuing to deform in a direction away from the display direction of the flexible screen 11.

Figure 9:
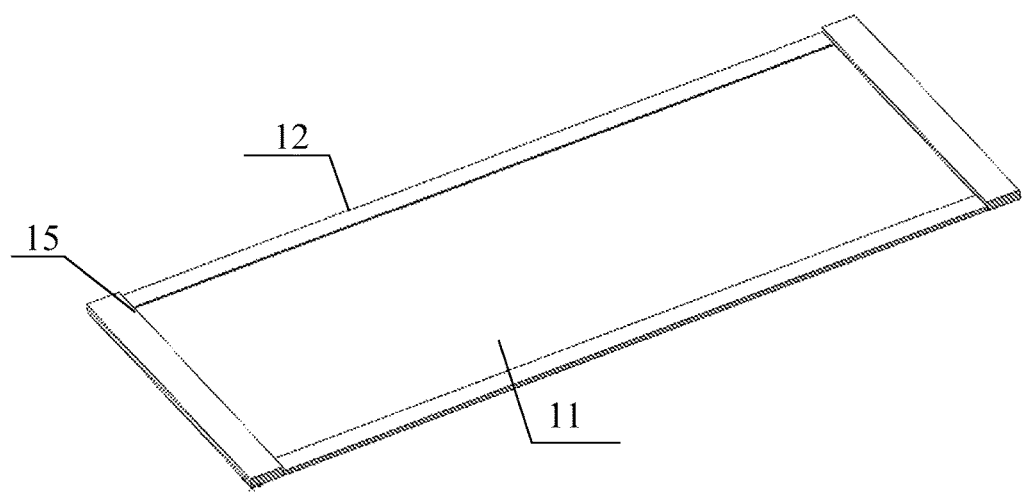
FIG. 9 illustrates a schematic structural diagram of another example of flexible electronic device in accordance with the present disclosure.

FIG. 9 illustrates a schematic structural diagram of another example of flexible electronic device in accordance with the present disclosure. The flexible electronic device further includes at least one rigid housing 15. In FIG. 9, two rigid housings 15 are illustrated as an example. The at least one rigid housing 15 can be connected to the second side 122 of the flexible shaft 12. For example, the at least one rigid housing 15 can be connected by mechanical connecting (e.g., riveting), welding, bonding, mechanical locking (e.g., stud locking), and any other suitable connection means.

In order to reduce the volume of the flexible electronic device, the at least one rigid housing 15 can encase the second side 122 of the flexible shaft 12. A portion of the flexible shaft 12 can be located inside the at least one rigid housing 15 to prevent the flexible shaft 12 from external damages.

Figure 10:
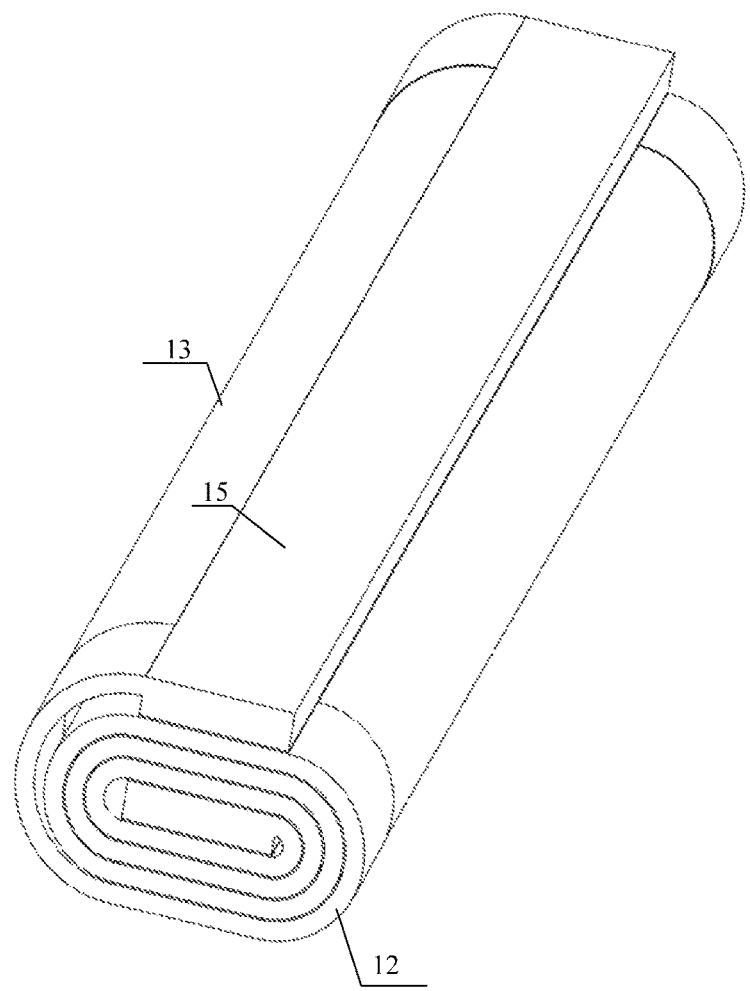
FIG. 10 illustrates a schematic diagram of the flexible electronic device in a bent state in accordance with the present disclosure.

FIG. 10 illustrates a schematic diagram of the flexible electronic device in a bent state in accordance with the present disclosure. With a force applied to the at least one rigid housing 15, the first side 121 of the flexible shaft 12 can deform to cause the flexible electronic device to change from the flat state to the bent state. As shown in FIG. 10, the flexible electronic device including at least one rigid housing is in the bent state.

Figure 11:
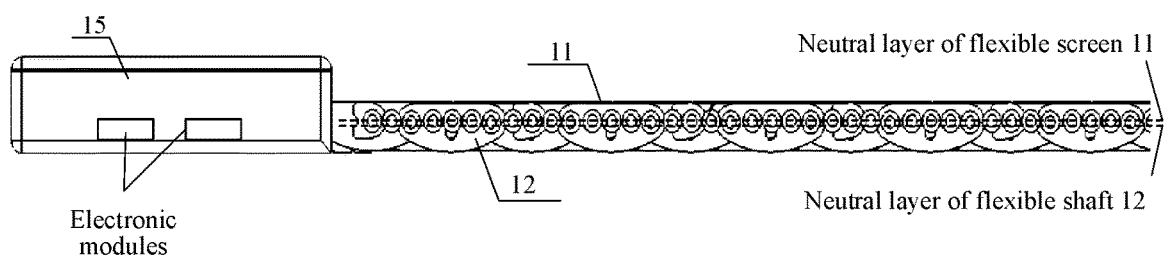
FIG. 11 illustrates a schematic front view of the flexible electronic device in accordance with the present disclosure.

FIG. 11 illustrates a schematic front view of the flexible electronic device in accordance with the present disclosure. The flexible shaft 12 and the rigid metal strip groups 133 are used as the inner frames of the flexible screen 11. As such, a flexible case outside the flexible screen 11 is not needed. Thus, the thickness occupied by the flexible case of the flexible screen 11 may be omitted, thereby reducing the thickness of the flexible screen 11.

The flexible screen 11 may be not thicker than the flexible shaft 12. For example, the thickness of the flexible screen 11 can be in a range from about 2 mm to about 4 mm. In some embodiments, the thickness of the rigid housing 15 can be about 3 mm to about 4 mm, and the thickness of the flexible screen 11 can be about 2 mm. In order to prevent the flexible screen 11 from being scratched, a protective layer can be provided on the outside of the flexible screen 11.

Omitting the flexible case provided outside the flexible screen 11 can eliminate the cost for material processing cost and flexible coating processing. Further, the problem of aging and fracture of the flexible case material, the problem of breaking and shedding of the flexible coating, and the problem of bonding failure between the flexible case and rigid metal strips and between the flexible case and flexible screen can be avoided.

The flexible electronic device can further include one or more electronic modules located in the rigid housing 15, such as a main board, a battery, a memory chip, etc., as schematically shown in FIG. 11. The one or more electronic modules allow the flexible electronic device to communicate with the flexible screen and other electronic devices. The electronic modules can be manufactured using existing techniques for manufacturing rigid (i.e., non-bendable) electronic devices.

The flexible screen 11 may include one or more flexible printed circuit boards or data lines that are respectively connected to the one or more electronic modules in the rigid housing 15. The connections between the one or more electronic modules and the circuit boards or data lines can include welding, bonding, carding, plugging in, or any other suitable connecting manner. The display information outputted from the one or more electronic modules of the rigid housing 15 can be displayed by the flexible screen 11. The flexible electronic device may also obtain display information of other electronic devices through the one or more electronic modules of the rigid housing 15 and present the display information of the other electronic devices on the flexible screen 11.

In this disclosure, relational terms such as "first" and "second" are used only to distinguish an item from another item without necessarily requiring or implying that any such relationship actually exists between these items. Moreover, the term "including," "comprising," or any other variant thereof is intended to encompass a non-exclusive inclusion so that the device includes not only those items but also other items that are not explicitly listed. In the absence of further restrictions, the phrase "including a . . . " followed by an item does not exclude the presence of additional items in the device.

The provision of the examples described herein (as well as clauses phrased as "such as," "e.g.," "including," or the like) should not be interpreted as limiting the disclosure to the specific examples; rather, the examples are intended to illustrate only some of many possible aspects.

Although the present disclosure has been described and illustrated in the foregoing illustrative embodiments, it is understood that the present disclosure has been made only by way of example, and that numerous changes in the details of embodiment of the present disclosure can be made without departing from the spirit and scope of the present disclosure. Features of the disclosed embodiments can be combined and rearranged in various ways. Without departing from the spirit and scope of the present disclosure, modifications, equivalents, or improvements to the present disclosure are conceivable to those skilled in the art and are intended to be encompassed within the scope of the present disclosure.

What is claimed is:

1. A flexible electronic device, comprising:
a flexible shaft including a first side and a second side not parallel to each other, wherein the first side deforms with a rotation of the flexible shaft, and the second side does not deform with the rotation of the flexible shaft;
a support member connected to the first side of the flexible shaft and including a connecting portion and a carrying portion; and
a flexible screen coupled to the first side and on a surface of the support member that includes a surface of the carrying portion, wherein the flexible screen deforms in synchronism with a deformation of the first side.

2. The flexible electronic device of claim 1, wherein:
the flexible screen and the flexible shaft do not overlap in a direction of the second side.

3. The flexible electronic device of claim 1, wherein:
an overlap error between a neutral layer of the flexible screen and a neutral layer of the flexible shaft is smaller than a preset value when the flexible shaft is in a flat state,
a tensile stress and a compressive stress on the neutral layer of the flexible shaft is close to zero when the flexible shaft is in a bent state, and
a tensile stress and a compressive stress on the neutral layer of the flexible screen is close to zero when the flexible screen is in a bent state.

4. The flexible electronic device of claim 3, wherein:
the preset value is about 0.1 mm.

5. The flexible electronic device of claim 3, wherein:
the preset value is a first preset value, and
a distance between the neutral layer of the flexible shaft and the surface of the support member is greater than a second preset value when the flexible shaft and the support member are in the flat state.

6. The flexible electronic device of claim 3, further comprising:
an adhesive layer between the surface of the support member and the flexible screen.

7. The flexible electronic device of claim 6, wherein:
a thickness of the adhesive layer is smaller than or equal to a distance between the neutral layer of the flexible screen and the neutral layer of the flexible shaft.

8. The flexible electronic device of claim 1, wherein:
one end of the connecting portion is connected to the first side of the flexible shaft; and
another end of the connecting portion is connected to the carrying portion.

9. The flexible electronic device of claim 1, wherein:
the carrying portion includes a plurality of rigid metal strip groups arranged in parallel; and
the plurality of rigid metal strip groups form the surface when the flexible shaft and the support member are in the flat state.

10. The flexible electronic device of claim 9, wherein:
a longitudinal direction of one of the rigid metal strip groups is perpendicular to a direction of the first side,
one end of the one of the rigid metal strip groups is connected with a first type shaft of the flexible shaft through the connecting portion, and
a relative mounting position of the first type shaft is unchanged during the deformation of the flexible shaft.

11. The flexible electronic device of claim 10, wherein:
the one of the rigid metal strip groups includes two rigid metal strips,
a longitudinal direction of one of the rigid metal strips is perpendicular to the direction of the first side,
one end of the one of the rigid metal strips is connected with the first type shaft of the flexible shaft through the connecting portion, and
the rigid metal strips of the rigid metal strip groups form the surface of the support member when the flexible shaft and the support member are in the flat state.

12. The flexible electronic device of claim 11, wherein:
the connecting portion includes a hollow structure, and
the first type shaft is fitted in the hollow structure.

13. The flexible electronic device of claim 12, wherein:
the connecting portion of a first one of the rigid metal strips of the one of the rigid metal strip groups includes a hollow circular member,
the connection portion of a second one of the rigid metal strips of the one of the rigid metal strip groups includes a hollow semicircular member, and
a radius of the hollow circular member is smaller than a radius of the hollow semicircular member.

14. The flexible electronic device of claim 13, wherein:
the hollow circular member protrudes from the first one of the rigid metal strips in a first direction,
the hollow semicircular member protrudes from the second one of the rigid metal strips in the first direction, and extends from the second one of the rigid metal strips in a second direction, and the first direction is perpendicular to the second direction when the flexible shaft and the support member are in the flat state.

15. The flexible electronic device of claim 1,
wherein the flexible shaft is a first flexible shaft
the flexible electronic device further comprising:
  a second flexible shaft,
  wherein:
    a first end in a longitudinal direction of the support member is connected to the first flexible shaft, and
    a second end in the longitudinal direction of the support member is connected to the second flexible shaft.

16. The flexible electronic device of claim 1, further comprising:
  a rigid housing,
  wherein the rigid housing is connected to the second side.

17. The flexible electronic device of claim 16, wherein:
the rigid housing encloses the second side, and
a portion of the flexible shaft is inside the rigid housing.

18. The flexible electronic device of claim 16, further comprising:
  electronic modules located inside the rigid housing, wherein the electronic module communicate with the flexible screen.

\* \* \* \* \*